United States Patent
Knoth et al.

(10) Patent No.: US 11,347,198 B2
(45) Date of Patent: May 31, 2022

(54) ADAPTIVE THERMAL CONTROL SYSTEM

(71) Applicant: Apple Inc., Cupertino, CA (US)

(72) Inventors: Matthias Knoth, San Jose, CA (US);
Ramesh B. Gunna, San Jose, CA (US);
Srikanth Balasubramanian, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 90 days.

(21) Appl. No.: 17/012,611

(22) Filed: Sep. 4, 2020

(65) Prior Publication Data
US 2022/0075343 A1 Mar. 10, 2022

(51) Int. Cl.
| | |
|---|---|
| H03M 1/06 | (2006.01) |
| G05B 19/406 | (2006.01) |
| H03M 1/12 | (2006.01) |
| H03M 1/46 | (2006.01) |
| H04W 52/36 | (2009.01) |

(Continued)

(52) U.S. Cl.
CPC ............ *G05B 19/406* (2013.01); *H03M 1/12* (2013.01); *H03M 1/46* (2013.01); *H04W 52/362* (2013.01); *G01K 3/00* (2013.01); *G01K 15/00* (2013.01); *G05B 2219/49216* (2013.01)

(58) Field of Classification Search
CPC ........ G05B 19/406; H03M 1/12; H03M 1/46; H04W 52/362; G01K 3/00; G01K 15/00
See application file for complete search history.

(56) References Cited

U.S. PATENT DOCUMENTS

| | | |
|---|---|---|
| 5,451,892 A | 9/1995 | Bailey |
| 5,940,786 A | 8/1999 | Steeby |

(Continued)

FOREIGN PATENT DOCUMENTS

| | | |
|---|---|---|
| CN | 1622046 A | 6/2005 |
| DE | 19531706 A1 | 3/1997 |

(Continued)

OTHER PUBLICATIONS

International Search Report and Written Opinion in International Application No. PCT/US2013/040740, dated Sep. 19, 2013, 7 pages.

(Continued)

*Primary Examiner* — Joseph J Lauture
(74) *Attorney, Agent, or Firm* — Kowert Hood Munyon Rankin and Goetzel PC; Rory D. Rankin (57) ABSTRACT

Systems, apparatuses, and methods for implementing an optimized adaptive thermal control mechanism for an integrated circuit (IC) are described. A control unit receives a digital input value which is representative of a temperature of an IC. The control unit compares the input value to at least two set points. A result of a first comparison determines whether an accumulator is incremented or decremented by a programmable gain value. A result of a second comparison determines whether the accumulator is primed with a preset ramp-up value. The preset ramp-up value is used since the accumulator can take several sensing cycles to reach the optimal control value while thermal gradients can become critical in only a few cycles. The output of the accumulator is provided to an actuator which adjusts parameter(s) to modulate the IC's temperature. The granularity and range of the accumulator matches the granularity and range of the actuator.

20 Claims, 8 Drawing Sheets

(51) Int. Cl.
*G01K 3/00* (2006.01)
*G01K 15/00* (2006.01)

(56) References Cited

U.S. PATENT DOCUMENTS

| | | |
|---|---|---|
| 5,994,752 A | 11/1999 | Sander et al. |
| 6,442,700 B1 | 8/2002 | Cooper |
| 7,087,439 B2 | 8/2006 | Ku |
| 7,149,645 B2 | 12/2006 | Mangrulkar et al. |
| 7,386,737 B2 | 6/2008 | Finkelstein et al. |
| 7,451,332 B2 | 11/2008 | Culbert et al. |
| 7,454,640 B1 | 11/2008 | Wong |
| 7,565,258 B2 | 7/2009 | Duarte |
| 7,569,904 B2 | 8/2009 | Oh et al. |
| 7,613,002 B2 | 11/2009 | Ye et al. |
| 7,690,843 B2 | 4/2010 | Bowden et al. |
| 7,878,016 B2 | 2/2011 | Rotem et al. |
| 8,136,366 B2 | 3/2012 | Li et al. |
| 9,383,789 B2 | 7/2016 | Lin et al. |
| 9,413,353 B2 | 8/2016 | Machnicki |
| 2004/0159904 A1 | 8/2004 | Clabes et al. |
| 2004/0204899 A1 | 10/2004 | Gunther et al. |
| 2005/0217290 A1 | 10/2005 | Watakabe et al. |
| 2006/0149974 A1 | 7/2006 | Rotem et al. |
| 2007/0124104 A1 | 5/2007 | Johns et al. |
| 2008/0022140 A1 | 1/2008 | Yamada et al. |
| 2009/0292404 A1 | 11/2009 | Adachi et al. |
| 2010/0073068 A1 | 3/2010 | Cho et al. |
| 2010/0094582 A1 | 4/2010 | Cox et al. |
| 2010/0117579 A1 | 5/2010 | Culbert et al. |
| 2011/0063937 A1 | 3/2011 | Eid et al. |
| 2011/0194223 A1 | 8/2011 | Kang et al. |
| 2011/0301777 A1 | 12/2011 | Cox et al. |
| 2011/0301778 A1 | 12/2011 | Liang et al. |
| 2013/0076381 A1 | 3/2013 | Takayanagi et al. |
| 2013/0184895 A1 | 7/2013 | Wen et al. |
| 2014/0062533 A1 | 3/2014 | Takayanagi |

FOREIGN PATENT DOCUMENTS

| | | | |
|---|---|---|---|
| EP | 2 573 531 A2 * | 3/2013 | ............... G01K 3/00 |
| JP | 2005293364 A | 10/2005 | |
| JP | 2007109085 A | 4/2007 | |
| JP | 2008026948 A | 2/2008 | |
| KR | 20050080822 A | 8/2005 | |
| TW | 200629059 A | 8/2006 | |
| WO | 2012058202 A1 | 5/2012 | |

OTHER PUBLICATIONS

Partial European Search Report in European Application No. 13171669.8, dated Dec. 10, 2013, 6 pages.
Extended European Search Report in European Application No. 13171669.8, dated Apr. 17, 2014, 12 pages.
Office Action in Japanese Patent Application No. 2013-130450, dated Jun. 16, 2014, 9 pages.
Decision to grant in Japanese Application No. 2013-130450, dated Oct. 14, 2014, 5 pages.
Notice of Preliminary Rejection in Korean Patent Application No. 10-2013-71805, dated Nov. 18, 2014, 11 pages.
Office Action in Taiwanese Patent Application No. 102119202, dated Dec. 8, 2014, 19 pages.
International Preliminary Report International Application No. PCT/US2013/040740, dated Dec. 31, 2014, 7 pages.
Communication pursuant to Article 94(3) EPC in European Patent Application No. 13171669.8, dated Mar. 26, 2015, 5 pages.
Decision of the Intellectual Property Office in Taiwanese Patent Application No. 102119202, dated Apr. 28, 2015, 17 pages.
Notice of Allowance in Korean Patent Application No. 10-2013-71805, dated May 19, 2015, 3 pages.
Office Action in Chinese Application No. 201310245720.X, dated Jan. 18, 2016, 31 pages.

\* cited by examiner

ADAPTIVE THERMAL CONTROL SYSTEM

BACKGROUND

Technical Field

Embodiments described herein relate to the field of electronic circuits and, more particularly, to implementing an adaptive thermal control system.

Description of the Related Art

Thermal management of high performance central processing units (CPUs) and systems on chips (SoCs) include temperature sensors for tracking temperature changes associated with chip operation. Typically, if the temperature reaches a given threshold level, a software thread is notified to modulate system performance to prevent overheating of the chip. Also, a hardware threshold comparator can invoke a safety switch to prevent overheating in the case when the software control algorithm failed to respond in a timely manner. These mechanisms attempt to maintain the die temperature within the silicon timing characterization temperature range. Meanwhile, the goal of a software thermal control system is to optimally extract computational performance for the main computational task while maintaining a thermal equilibrium between heat production and cooling device heat flow. This results in a non-critical die temperature and predictable computational performance of the chip.

However, high performance systems such as CPUs and hardware accelerators with high power draw are able to produce critical thermal transients faster than is manageable via software control loops. In such cases, a hardware control loop is implemented to control the system performance. Silicon area and implementation complexity for a classical proportional-integral (PI) control system is high. Multipliers, adders, large integrator registers, saturation logic, and a quantizer are needed to adapt to the actuation. Hence, often more simple control schemes are applied such as fast switching on/off regulators, step range based comparators, and switching fixed performance levels. Such systems achieve thermal control of the system, but in many cases allow only sub-optimal performance for the controlled computational system.

SUMMARY

Systems, apparatuses, and methods for implementing adaptive thermal control of an integrated circuit (IC) are contemplated. In one embodiment, a control unit receives a digital input value which is representative of a temperature of an IC. The control unit compares the digital input value to at least two set points. A result of a first comparison determines whether an accumulator is incremented or decremented by a programmable gain value. A result of a second comparison determines whether the accumulator is primed with a preset ramp-up value. The preset ramp-up value is used since the accumulator can take several sensing cycles to reach the optimal control value while thermal gradients can become critical in only a few cycles. The output of the accumulator is provided to an actuator which adjusts one or more parameters which modulate the temperature of the IC. In one embodiment, the granularity and range of the accumulator matches the granularity and range of the actuator.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
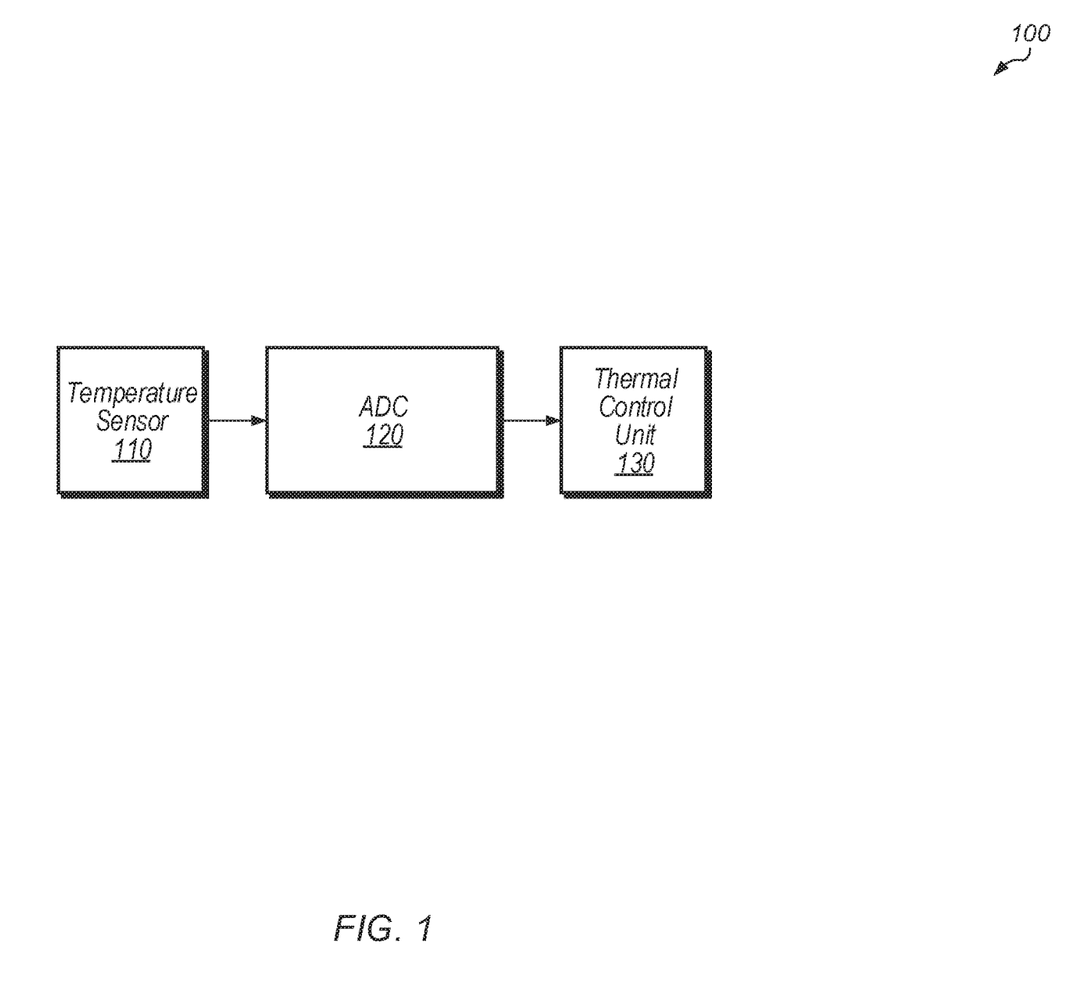
FIG. 1 is a generalized block diagram of one embodiment of an integrated circuit implementing an adaptive thermal control algorithm.

Referring to FIG. 1, a block diagram of one embodiment of an integrated circuit (IC) 100 implementing an adaptive thermal control algorithm is shown. In one embodiment, IC 100 includes temperature sensor 110, analog-to-digital converter (ADC) 120, and thermal control unit 130. In some embodiments, the components of IC 100 may actually be located in two or more separate IC's. Additionally, it should be understood that IC 100 may also include any number of other components (e.g., processor, voltage regulator, capacitors, resistors) which are not shown to avoid obscuring the figure.

Temperature sensor 110 is representative of any number and type of temperature sensors for measuring the temperature of IC 100. While only one temperature sensor 110 is shown in FIG. 1, it should be understood that IC 100 may contain multiple temperature sensors in some embodiments, with sensors spread throughout the chip. In some cases, temperature sensors 110 are located in hot spots within IC 100, with the hot spots being places that are expected or predicted to generate large amounts of heat. In embodiments with multiple temperature sensors 110, the temperature readings may be averaged, the highest temperature reading may be used, or other techniques for combining the temperature readings may be employed.

In one embodiment, the frequency at which temperature sensor 110 measures the temperature is based on the expected ramp-up rate of the temperature of IC 100. It is desired that temperature sensor 110 takes enough readings to detect a quick rise in the temperature of IC 100 so that thermal control unit 130 can respond in a timely manner to reduce the temperature before chip damage occurs. This frequency can also dictate how often ADC 120 samples the temperature readings to convert these readings into digital values. The digital values are then provided to thermal control unit 130.

In one embodiment, thermal control unit 130 compares each digital input value to at least two set points. A result of a first comparison determines whether an accumulator is incremented or decremented by a programmable gain value. A result of a second comparison determines whether the accumulator is primed with a preset ramp-up value. The preset ramp-up value is used since the accumulator can take several sensing cycles to reach the optimal control value while thermal gradients can become critical in only a few cycles. The output of the accumulator is provided to an actuator which adjusts one or more parameters which modulate the temperature of the IC. In one embodiment, the granularity and range of the accumulator matches the granularity and range of the actuator. It is noted that thermal control unit 130 can be implemented using any suitable combination of hardware and/or software.

Figure 2:
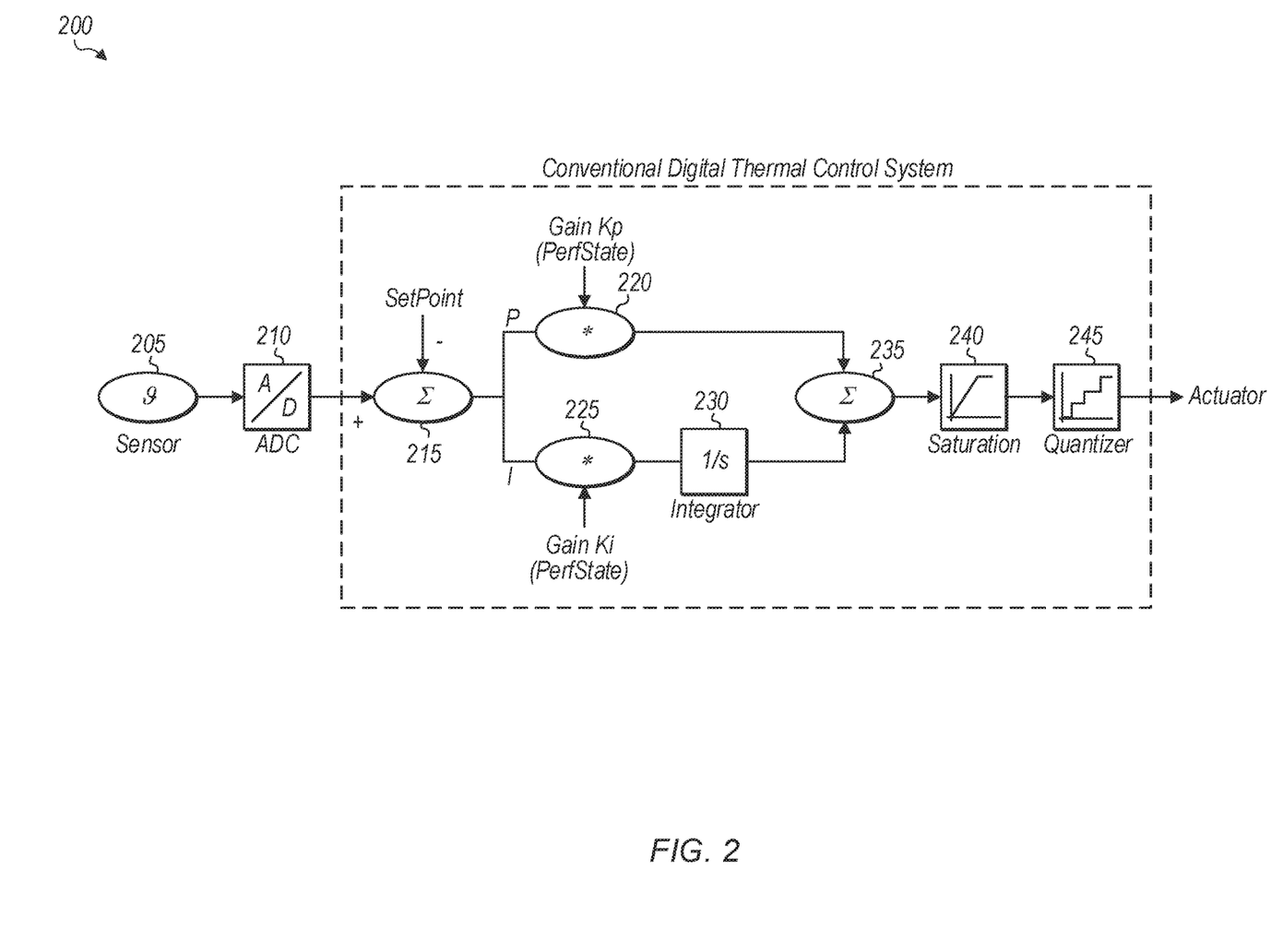
FIG. 2 is a generalized block diagram illustrating one embodiment of a proportional-integral (PI) thermal control system.

Turning now to FIG. 2, a block diagram of one embodiment of a conventional proportional-integral (PI) thermal control system 200 is shown. In one embodiment, PI thermal control system 200 includes temperature sensor 205, analog-to-digital converter (ADC) 210, set-point comparator 215, proportional gain multiplier 220, integral gain multiplier 225, integrator 230, adder 235, saturation unit 240, and quantizer 245. The output of quantizer 245 is provided to an actuator (not shown).

PI thermal control system 200 compares a temperature reading to a single set-point using comparator 215. Then, the result of comparator 215 is coupled to multipliers 220 and 225. Multiplier 220 multiplies the comparison by a proportional (or P) gain value, and multiplier 225 multiplies the comparison by an integral (or I) gain value. These multipliers 220 and 225 tend to be large devices. As a result, one drawback of PI thermal control system 200 is the relatively large area taken up by the components of the system. Accordingly, thermal control systems that take up a smaller amount of silicon area are desired. Also, thermal control systems that can prevent damage to a chip by responding quickly to thermal gradients are also desired. Throughout the remainder of this disclosure, methods and mechanisms for addressing these and other issues will be described.

Figure 3:
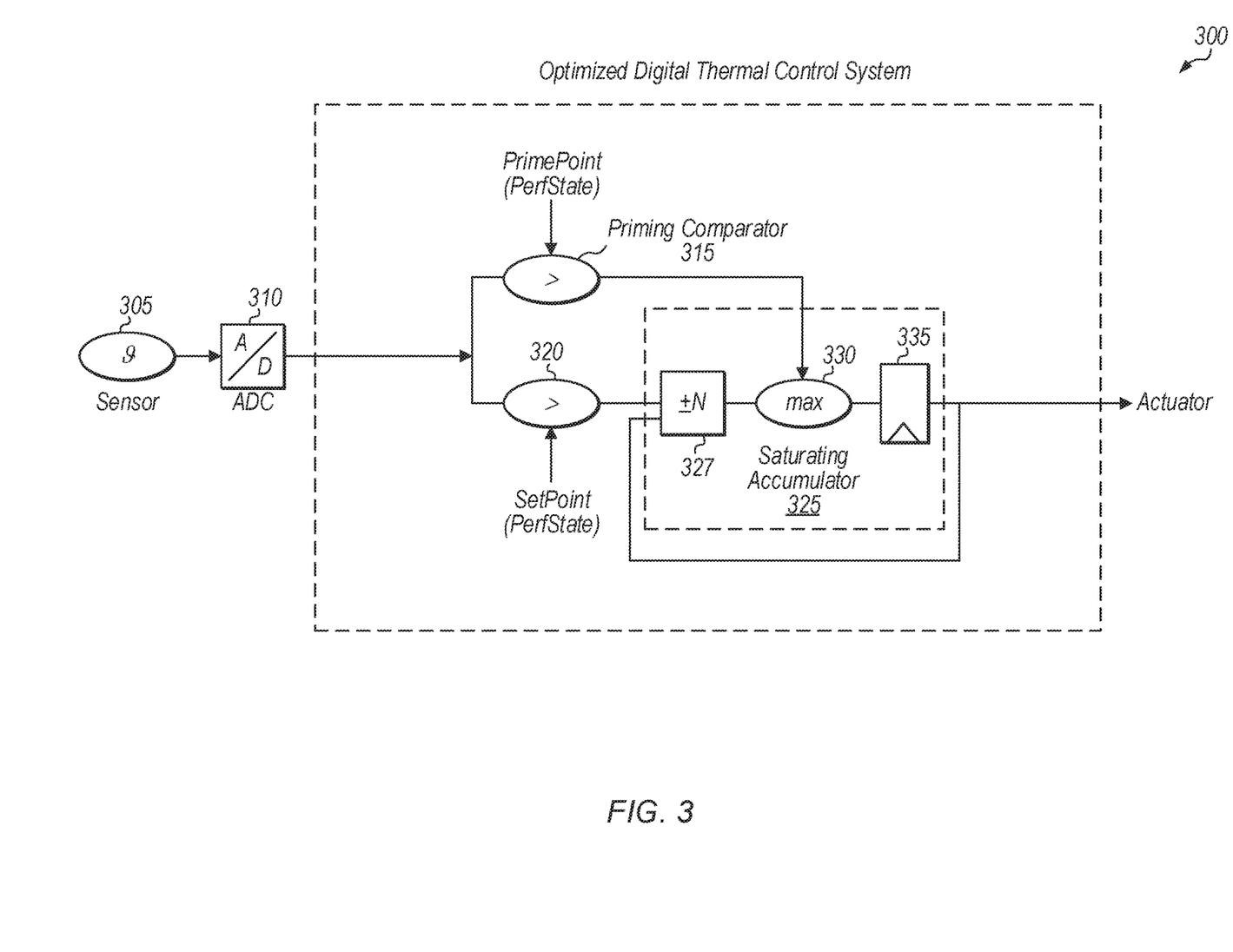
FIG. 3 is a block diagram of one embodiment of an optimized adaptive thermal control mechanism for an integrated circuit.

Referring now to FIG. 3, a block diagram of one embodiment of an optimized adaptive thermal control mechanism 300 for an integrated circuit is shown. In one embodiment, optimized adaptive thermal control mechanism 300 includes temperature sensor 305, ADC 310, priming comparator 315, set point comparator 320, and saturating accumulator 325. In one embodiment, saturating accumulator 325 is represented by programmable gain increment/decrement unit 327, preset ramp-up unit 330, and flip-flop 335. It is noted that programmable gain increment/decrement unit 327 may also be referred to as counter 327. The output of flip-flop 335 is provided to an actuator (not shown). The actuator controls one or more parameters related to the performance of the host system or host apparatus.

As compared to thermal control system 200 (of FIG. 2), adaptive thermal control mechanism 300 consumes less area of the overall integrated circuit (IC). The output of ADC 310 is coupled to priming comparator 315 and set point comparator 320. If the output of ADC 310 is greater than the set point temperature, then a programmable step-size value (i.e., N) is added to the accumulator value. Otherwise, if the output of ADC 310 is less than the set point temperature, then the programmable step-size value is subtracted from the accumulator value. If the output of ADC 310 is equal to the set point temperature, different actions may be taken that vary according to the embodiment. For example, in one embodiment, if the output of ADC 310 is equal to the set point temperature, the accumulator value can remain the same. Alternatively, in another embodiment, if the output of ADC 310 is equal to the set point temperature, the accumulator value can be reduced by the programmable step-size value. In a further embodiment, if the output of ADC 310 is equal to the set point temperature, the accumulator value can be increased by the programmable step-size value.

In one embodiment, if the output of ADC 310 is less than or equal to a prime point temperature, as determined by prime point comparator 315, then the accumulator value is unchanged. When the output of ADC 310 is less than a prime point temperature, then the output of set point comparator 320 determines the adjustment that is applied to the accumulator value. However, if the output of ADC 310 is greater than the prime point temperature, then the accumulator value is increased to a preset ramp-up value. This allows optimized adaptive thermal control system 300 to react quickly in response to thermal gradients. The accumulator value is provided to the actuator to cause the temperature to be controlled to prevent overheating of the IC.

In one embodiment, the actuator is controlled by a thermometer code which specifies how many instructions can be issued in a given window. For example, in one embodiment, a 16-bit value is provided to the actuator, and the number of 1's in the 16-bit value determines the amount of throttling applied to the issuance of instructions by a processor. For example, if the 16-bit value is all 0's, then there is no throttling and the processor can issue an instruction in each cycle over the next 16 cycles. In this example, if the 16-bit value is all 1's, then this is the maximum throttling state, and the processor is not allowed to issue any instructions over the next 16 cycles. If the 16-bit value includes 8 1's and 8 0's, then this is a half-throttled state, and the processor can issue 8 instructions over the next 16 cycles. It is noted that this is an example of one mechanism for controlling the power consumption of a device. In other embodiments, other throttling and/or temperature reduction techniques may be used.

For example, in another embodiment, the actuator may reduce the voltage supplied to one or more circuits in response to receiving a throttling value. The amount that the voltage is reduced may be proportional to the throttling value. In a further embodiment, the actuator reduces the frequency supplied to one or more circuits in response to receiving a throttling value. In a still further embodiment, the actuator activates a cooling system, heat sink, fan, or other device in response to receiving a throttling value or throttling command (i.e., a command to reduce the temperature of the device). Other techniques for reducing the temperature of a device or system are possible and are contemplated. It is noted that the actuator may combine any of the previous techniques together in a single embodiment. In other words, the actuator may throttle multiple different mechanisms or parameters where each individual mechanism/parameter causes a reduction in the temperature of the device.

Figure 4:
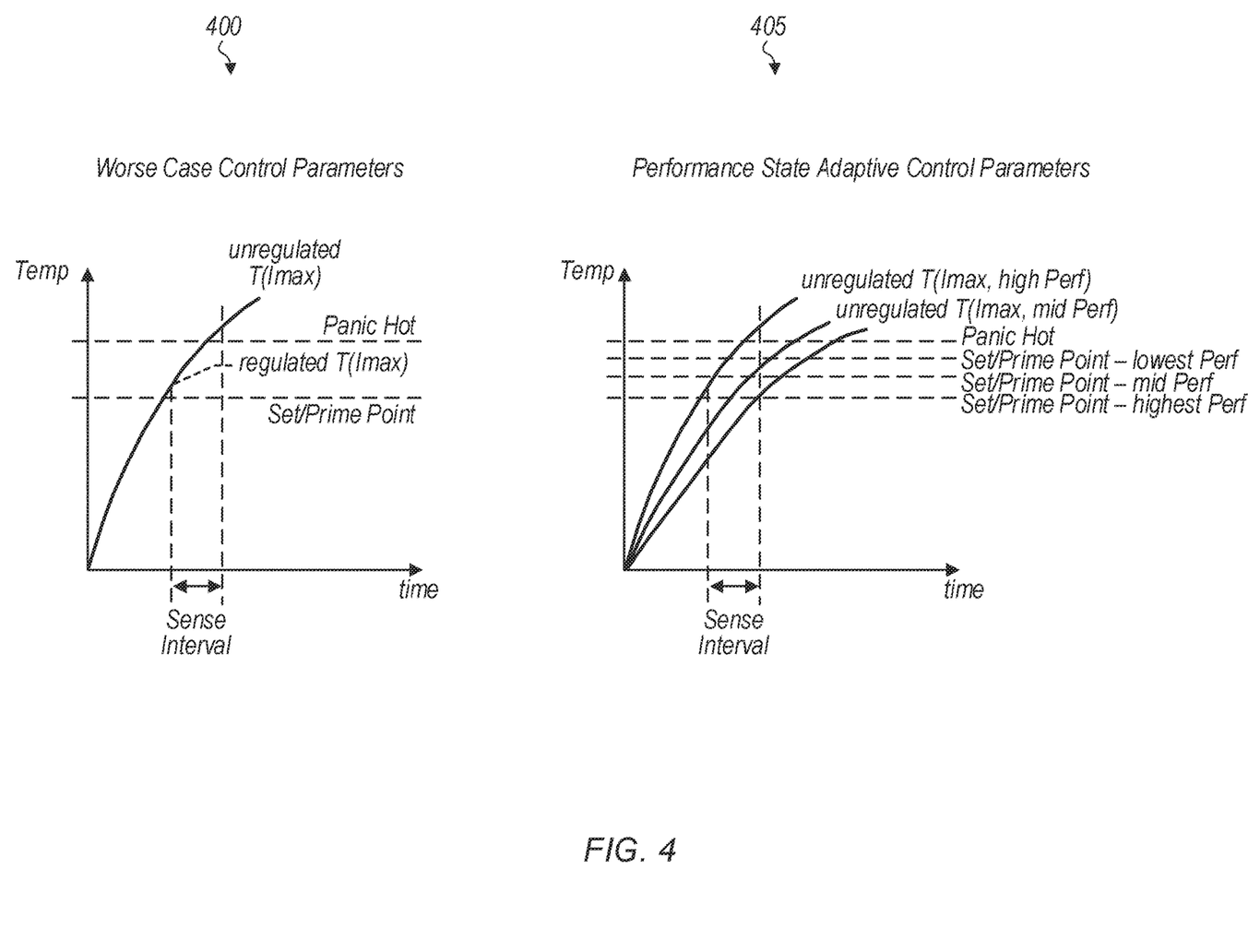
FIG. 4 illustrates diagrams of plots of temperature versus time for various control parameters.

Turning now to FIG. 4, diagrams 400 and 405 of plots of temperature versus time for various control parameters are shown. Diagram 400 shows the divergence between an unregulated temperature over time of a first circuit which is not being throttled and a regulated temperature over time of a second circuit which is being throttled. The solid line of diagram 400 is one example of a worst-case scenario of how quickly the temperature can ramp-up for a given circuit, device, or system based on a high power consumption application. The dashed-line of diagram 400 illustrates another example of a given circuit being regulated after the temperature rises above the set point. The sense interval indicates the time from sensing the temperature to when a corrective action is taken to reduce the temperature. Two thresholds are indicates in diagram 400, the first is a set/prime point and the second is a panic hot threshold which represents the temperature which should not be exceeded for the device.

Diagram 405 illustrates the temperature versus time plots for three different scenarios which vary according to the performance state of a processor. A high performance state will ramp up in temperature more quickly as compared to the mid-level performance state. Therefore, a thermal control unit is more conservative when the processor is in a high performance state. In one embodiment, being more conservative means using a lower set point and priming point. The lowest performance state, by comparison, has a lower rate of increase of temperature as compared to the other performance states. Accordingly, in one embodiment, the thermal control unit uses a higher set point and priming point for the lowest performance state as compared to the higher performance states.

Figure 5:
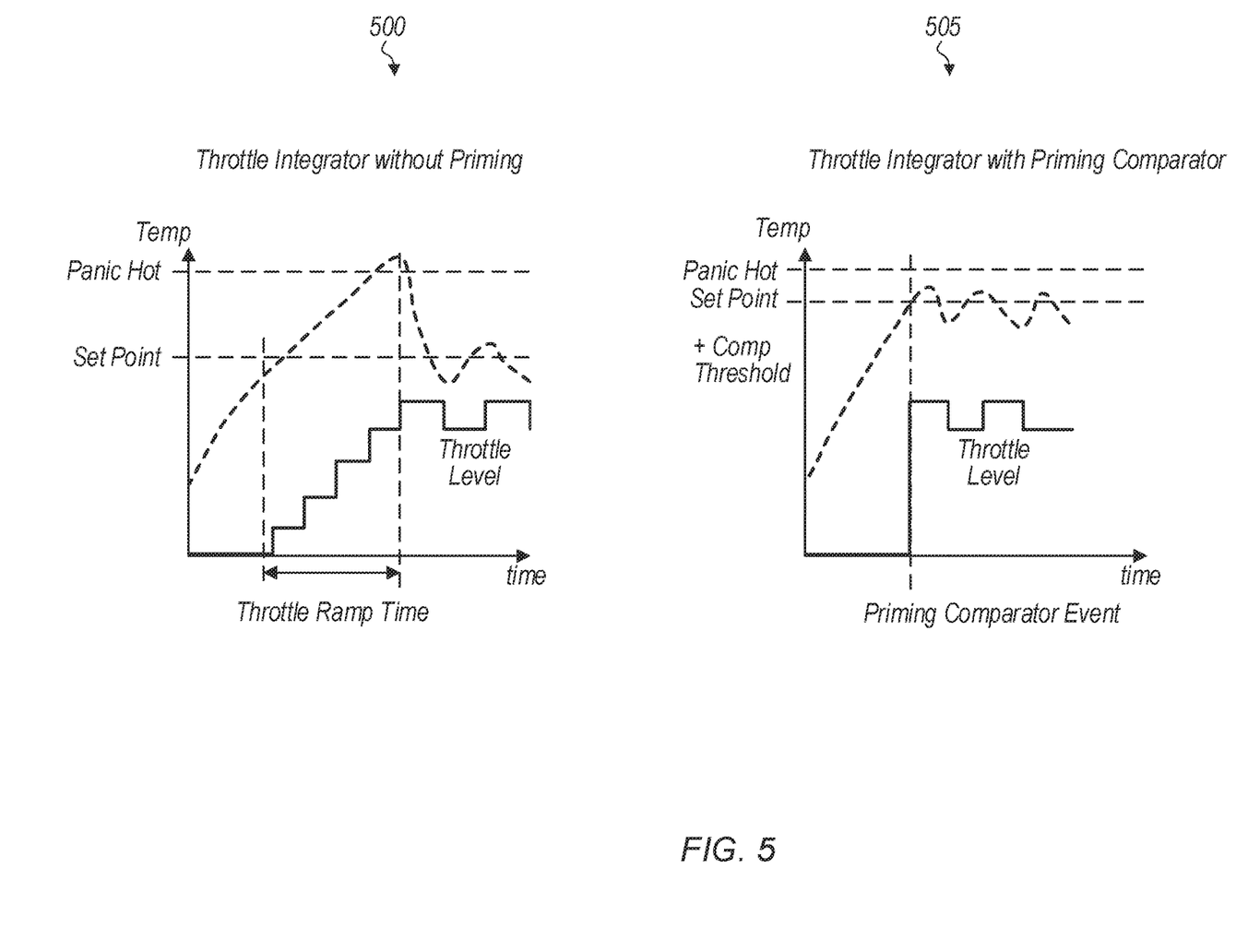
FIG. 5 illustrates temperature diagrams for two types of integrators.

Referring now to FIG. 5, temperature diagrams for two types of integrators are shown. Diagram 500 shows an example temperature versus time plot for a throttle integrator without priming. As can be seen in diagram 500, as the temperature exceeds the set point, the throttle starts to move up in small step sizes. Since the temperature is rising faster than the throttling is able to increase, the temperature reaches the panic hot threshold before the throttle level is able to reduce the temperature. For applications with a fast-rising temperature profile, a throttle integrator without priming is not able to react fast enough to prevent the temperature from exceeding the panic hot threshold.

On the other hand, diagram 505 illustrates a temperature versus time plot for a throttle integrator with a priming comparator. When the temperature reaches the set point, the throttle level jumps to a preset ramp-up level. This is a much faster reaction to the temperature exceeding the set point than the throttle integrator without priming is able to achieve based on using small step size increases of the throttling. The rapid throttling action enabled by the priming comparator allows the temperature to be brought under control before the temperature reaches the panic hot threshold.

Figure 6:
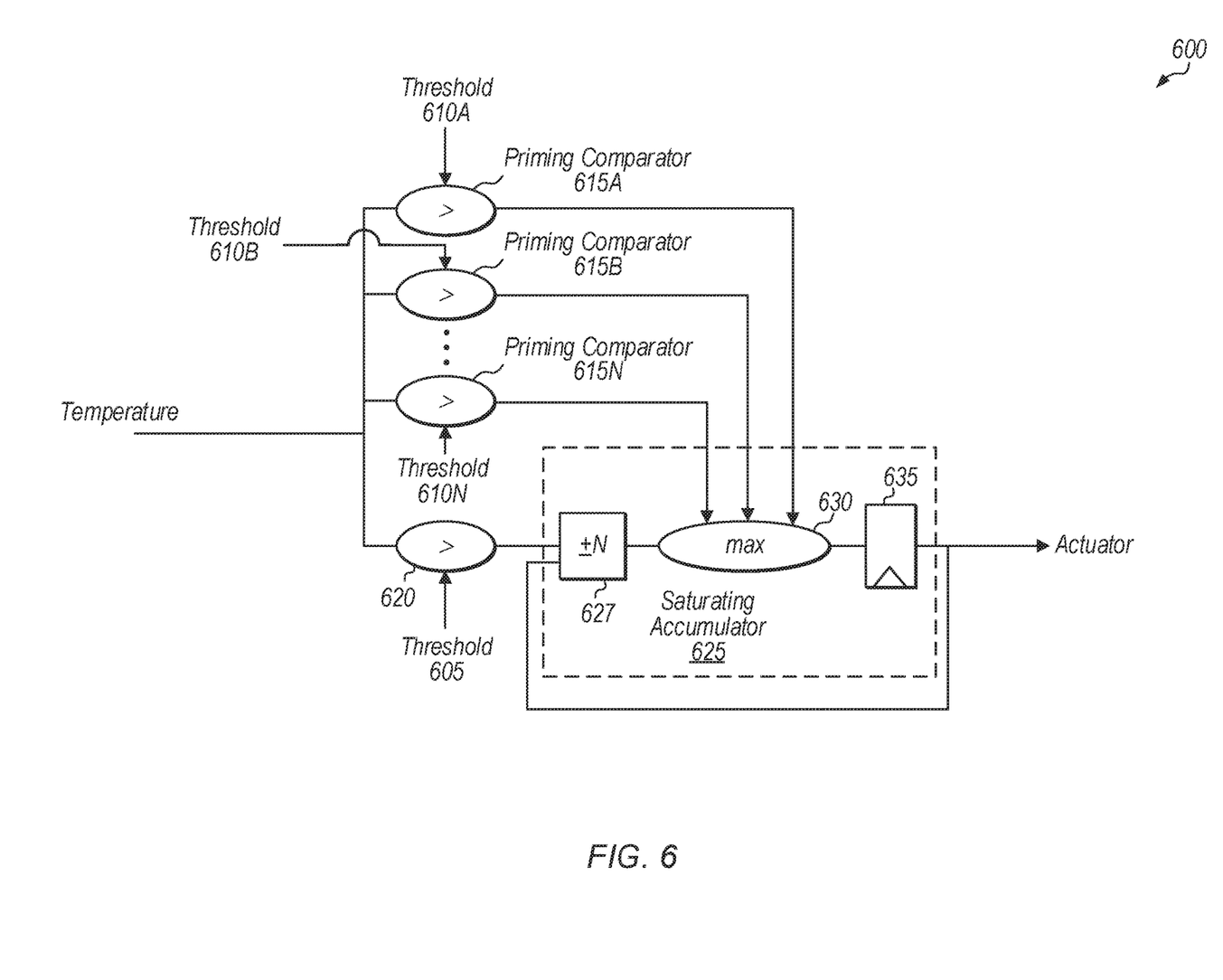
FIG. 6 is a block diagram of one embodiment of an adaptive thermal control mechanism.

Turning now to FIG. 6, a block diagram of one embodiment of an adaptive thermal control mechanism 600 is shown. In one embodiment, adaptive thermal control mechanism 600 includes multiple priming comparators 615A-N for comparing against multiple thresholds 610A-N. The number of priming comparators 615A-N may vary from embodiment to embodiment. Adaptive thermal control system 600 also includes set-point comparator 620, and saturating accumulator 625. In one embodiment, saturating accumulator 625 includes counter 627, present unit 630, and flip-flop 635. Set-point comparator 620 compares the temperature input value to threshold 605 to determine whether counter 627 is incremented or decremented by the counter value N, where N is a positive integer which may vary according to the embodiment.

Depending on the value of the temperature input received by mechanism 600, the value set by unit 630 may vary depending on where the temperature falls as compared to the multiple thresholds 610A-N. This allows for fine-tuning the preset value that is applied to saturating accumulator 625. For example, in one embodiment, software programs thresholds 610A-N based on the operating conditions of the host system or device. In this embodiment, software programs a first set of threshold 610A-N if the processor is in a high performance state. If the processor is in a mid-level performance state, software programs a second set of thresholds 610A-N which are different from the first set of thresholds 610A-N. Continuing with this example, if the processor is in a low performance state, software programs a third set of thresholds 610A-N. For these different performance states, software programs present unit 630 to use different ramp-up values depending on the results of the comparisons of priming comparators 615A-N. Different applications running on the host system or device may have different thermal profiles, and these applications can program adaptive thermal control mechanism 600 to be optimized according to the specific requirements of each application.

Figure 7:
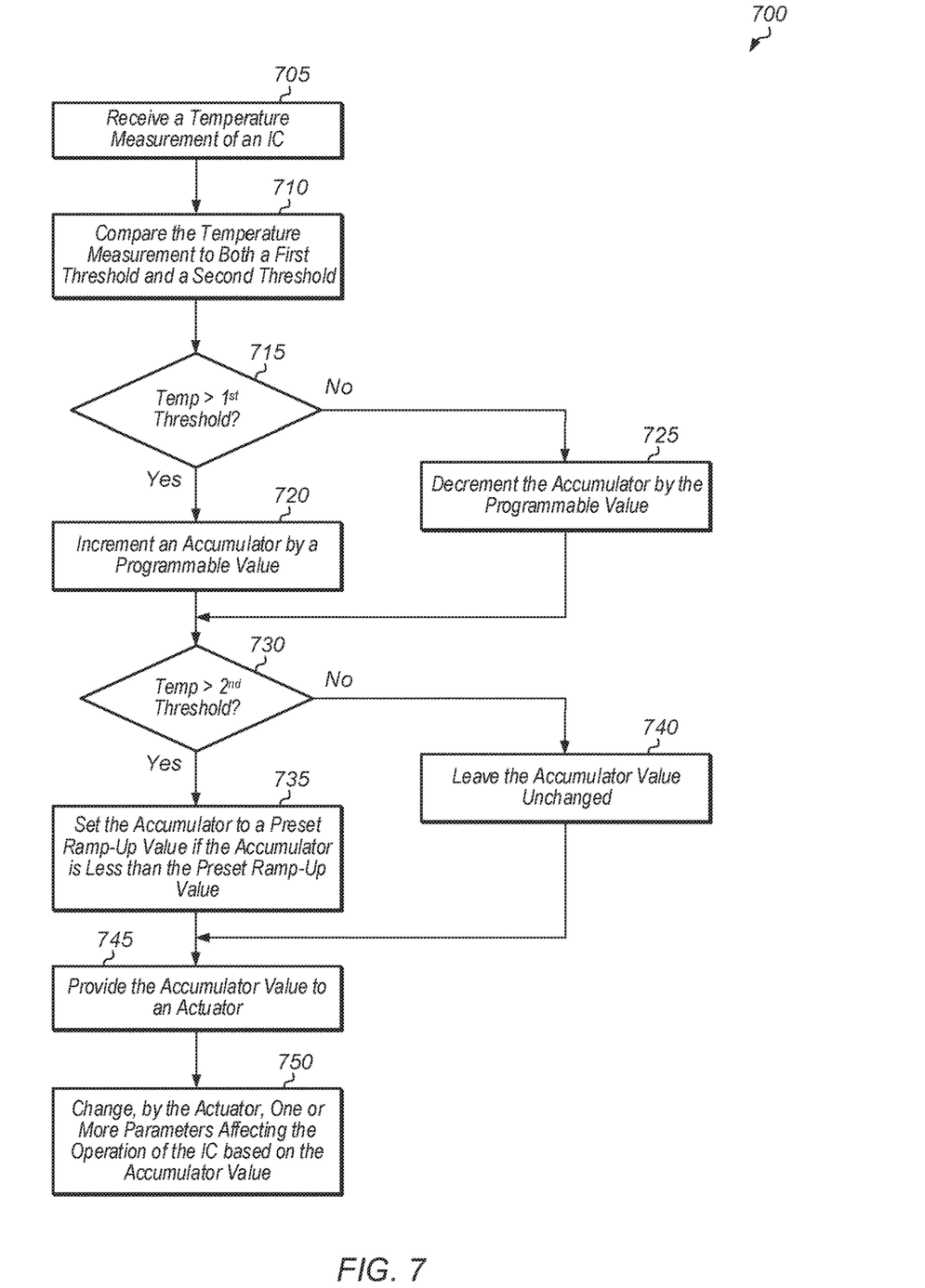
FIG. 7 is a flow diagram of one embodiment of a method for implementing an optimized adaptive thermal control system for an integrated circuit (IC).

Referring now to FIG. 7, a generalized flow diagram of one embodiment of a method 700 for implementing an optimized adaptive thermal control system for an integrated circuit (IC) is shown. For purposes of discussion, the steps in this embodiment are shown in sequential order. However, in other embodiments some steps may occur in a different order than shown, some steps may be performed concurrently, some steps may be combined with other steps, and some steps may be absent.

A thermal control unit receives a temperature measurement of an integrated circuit (IC) (block 705). The thermal control unit compares the temperature measurement to both a first threshold and a second threshold (block 710). It is assumed for the purposes of this discussion that the second threshold is lower than the first threshold. It is noted that the first threshold may also be referred to herein as a "set point", and the second threshold may also be referred to herein as a "prime point". In other embodiments, the thermal control unit may compare the temperature to three or more thresholds.

If the temperature measurement is greater than the first threshold (conditional block 715, "yes" leg), then the control unit increments an accumulator by a programmable value (i.e., N) (block 720). It is noted that the control unit may truncate increment the accumulator in block 720 up to the maximum value without rolling over. Otherwise, if the temperature measurement is less than or equal to the first threshold (conditional block 715, "no" leg), then the control unit decrements the accumulator by the programmable value (block 725). Block 725 may be a truncation decrement step such that the accumulator only goes down to zero and then stops at zero. In other words, in one embodiment, the accumulator is a saturating accumulator such that increments when the accumulator is at the maximum value will cause the accumulator to stay at the maximum value and decrements when the accumulator is at the minimum value will cause the accumulator to stay at the minimum value.

If the temperature measurement is greater than the second threshold (conditional block 730, "yes" leg), then the control unit sets the accumulator to a preset ramp-up value if the accumulator is less than the preset ramp-up value (block 735). Otherwise, if the temperature measurement is less than or equal to the second threshold (conditional block 730, "no" leg), then the control unit leaves the accumulator value unchanged (block 740). After blocks 735 and 740, the control unit provides the accumulator value to an actuator (block 745). In one embodiment, a granularity and range of the accumulator matches a granularity and range of the actuator. In other words, the number of states (i.e., different values) of the counter matches the number of throttle states for throttling the IC. For example, if there are 16 different throttle states, then a 4-bit counter will be implemented. If there are 32 different throttle states, then a 5-bit counter will be used, and so on.

Next, the actuator changes one or more parameters affecting the operation of the IC based on the accumulator value (block 750). In one embodiment, the actuator reduces the instruction issuance rate of a processor on the IC if the accumulator value is greater than a threshold. In other embodiments, the actuator changes other values associated with the IC. After block 750, method 700 ends. It is noted that method 700 may be repeated for each new temperature measurement of the IC. The frequency with which method 700 is repeated may be dependent on a maximum expected temperature ramp-up rate of the IC. In other words, method 700 may be repeated more frequently if the temperature of the IC is expected to increase relatively rapidly in certain scenarios.

Figure 8:
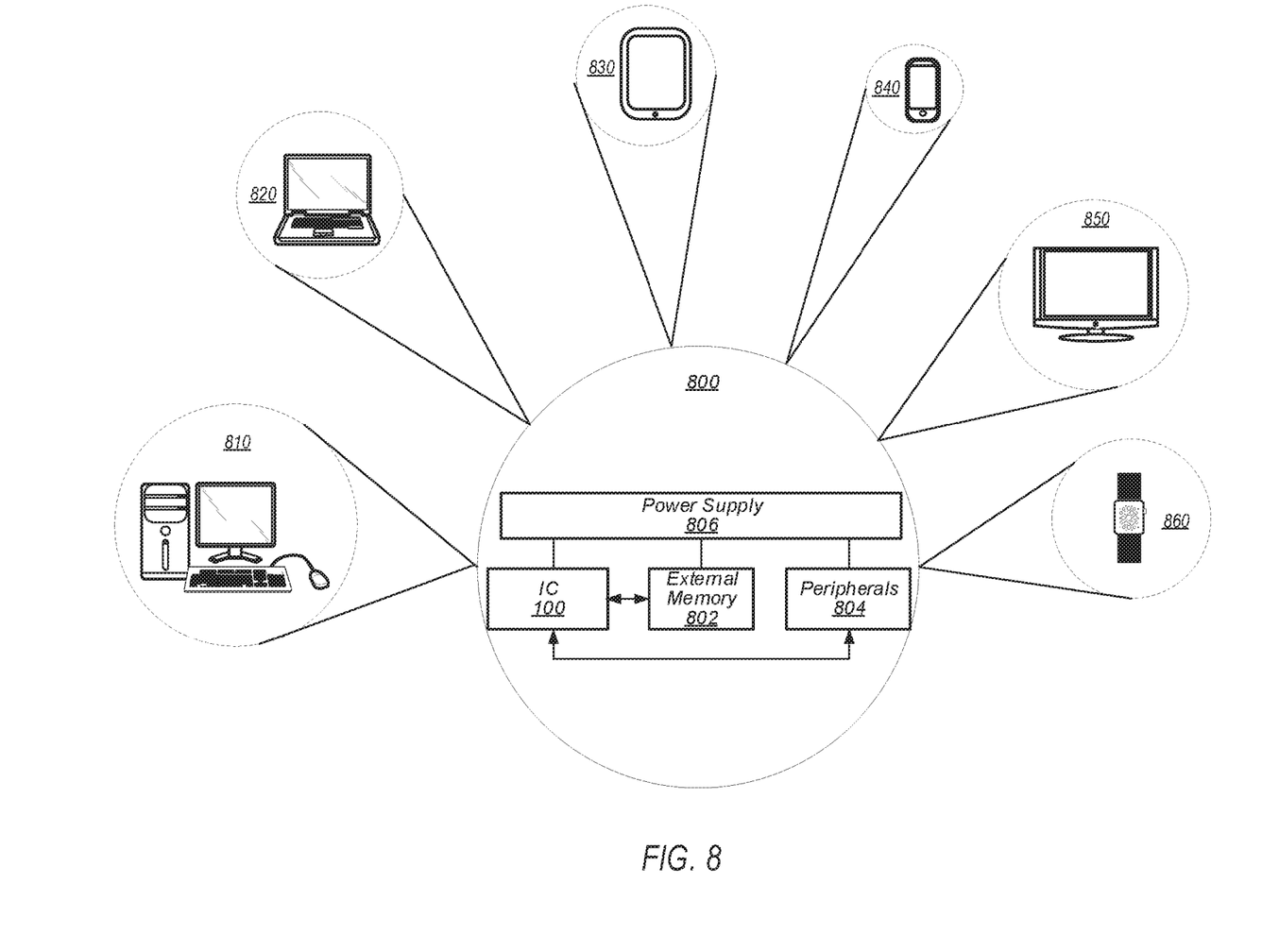
FIG. 8 is a block diagram of one embodiment of a system.

Turning now to FIG. 8, a block diagram of one embodiment of a system 800 is shown. As shown, system 800 may represent chip, circuitry, components, etc., of a desktop computer 810, laptop computer 820, tablet computer 830, cell or mobile phone 840, television 850 (or set top box configured to be coupled to a television), wrist watch or other wearable item 860, or otherwise. Other devices are possible and are contemplated. In the illustrated embodiment, the system 800 includes at least one instance of integrated circuit (IC) 100 (of FIG. 1) coupled to one or more peripherals 804 and the external memory 802. A power supply 806 is also provided which supplies the supply voltages to IC 100 as well as one or more supply voltages to the memory 802 and/or the peripherals 804. In various embodiments, power supply 806 may represent a battery (e.g., a rechargeable battery in a smart phone, laptop or tablet computer). In some embodiments, more than one instance of IC 100 may be included (and more than one external memory 802 may be included as well).

The memory 802 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 804 may include any desired circuitry, depending on the type of system 800. For example, in one embodiment, peripherals 804 may include devices for various types of wireless communication, such as wife, Bluetooth, cellular, global positioning system, etc. The peripherals 804 may also include additional storage, including RAM storage, solid state storage, or disk storage. The peripherals 804 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
    an accumulator; and
    a control unit configured to:
        compare a temperature value to at least two set points;
        increment or decrement the accumulator based on a result of a first comparison of the temperature value to a first set point;
        set the accumulator to a ramp-up value based on a result of a second comparison of the temperature value to a second set point; and
        adjust one or more parameters affecting the temperature of the circuit based on the output of the accumulator.

2. The circuit as recited in claim 1, wherein a granularity and range of the accumulator match a granularity and range of the actuator.

3. The circuit as recited in claim 1, wherein the accumulator is incremented or decremented by a programmable step size per cycle.

4. The circuit as recited in claim 1, wherein the one or more parameters adjusted comprise a number of instructions issued by a processor.

5. The circuit as recited in claim 1, further comprising an analog to digital converter (ADC) configured to sample an output of a temperature sensor, wherein the control unit is configured to receive a sampled output from the ADC, and wherein the sampled output is the temperature value.

6. The circuit as recited in claim 1, wherein the control unit is further configured to:
increment the accumulator by a step size responsive to the temperature value being greater than the first set point; and
decrement the accumulator by the step size responsive to the temperature value being less than or equal to the first set point.

7. The circuit as recited in claim 1, wherein the control unit is further configured to set the accumulator to the ramp-up value if the accumulator is less than the ramp-up value responsive to the temperature value being greater than the second set point, wherein the second set point is less than the first set point.

8. A method comprising:
comparing, by a control unit, a temperature value to at least two set points;
incrementing or decrementing an accumulator based on a result of a first comparison of the temperature value to a first set point;
setting the accumulator to a ramp-up value based on a result of a second comparison of the temperature value to a second set point; and
adjusting one or more parameters affecting the temperature of a circuit based on the output of the accumulator.

9. The method as recited in claim 8, wherein a granularity and range of the accumulator match a granularity and range of the actuator.

10. The method as recited in claim 8, wherein the accumulator is incremented or decremented by a programmable step size per cycle.

11. The method as recited in claim 8, wherein the one or more parameters comprise a number of instructions issued by a processor.

12. The method as recited in claim 8, further comprising sampling, by an analog to digital converter (ADC), an output of a temperature sensor and providing the sampled output from the ADC to the control unit, wherein the sampled output is the temperature value.

13. The method as recited in claim 8, further comprising:
incrementing the accumulator by a step size responsive to the temperature value being greater than the first set point; and
decrementing the accumulator by the step size responsive to the temperature value being less than or equal to the first set point.

14. The method as recited in claim 8, further comprising setting the accumulator to the ramp-up value if the accumulator is less than the ramp-up value responsive to the temperature value being greater than the second set point, wherein the second set point is less than the first set point.

15. A system comprising:
an analog-to-digital converter (ADC) to sample a temperature reading to generate a digital value;
an accumulator; and
a control unit configured to:
compare the digital value to at least two set points;
increment or decrement the accumulator based on a result of a first comparison of the digital value to a first set point;
set the accumulator to a ramp-up value based on a result of a second comparison of the digital value to a second set point; and
adjust one or more parameters affecting the temperature of the circuit based on the output of the accumulator.

16. The system as recited in claim 15, wherein a granularity and range of the accumulator match a granularity and range of the actuator.

17. The system as recited in claim 16, wherein the accumulator is incremented or decremented by a programmable step size per cycle.

18. The system as recited in claim 16, wherein the one or more parameters comprise a number of instructions issued by a processor.

19. The system as recited in claim 15, wherein the control unit is further configured to:
increment the accumulator by a step size responsive to the digital value being greater than the first set point; and
decrement the accumulator by the step size responsive to the digital value being less than or equal to the first set point.

20. The system as recited in claim 15, wherein the control unit is further configured to set the accumulator to the ramp-up value if the accumulator is less than the ramp-up value responsive to the digital value being greater than the second set point, wherein the second set point is less than the first set point.

* * * * *

UNITED STATES PATENT AND TRADEMARK OFFICE
CERTIFICATE OF CORRECTION

PATENT NO. : 11,347,198 B2
APPLICATION NO. : 17/012611
DATED : May 31, 2022
INVENTOR(S) : Knoth et al.

Page 1 of 1

It is certified that error appears in the above-identified patent and that said Letters Patent is hereby corrected as shown below:

In the Claims

Column 8, Claim 1, Line 64, please delete "the output" and substitute -- an output --.

Column 8, Claim 2, Line 67, please delete "the actuator" and substitute -- an actuator --.

Column 9, Claim 8, Line 36, please delete "the output" and substitute -- an output --.

Column 9, Claim 9, Line 39, please delete "the actuator" and substitute -- an actuator --.

Column 10, Claim 15, Line 26, please delete "the circuit" and substitute -- a circuit --.

Column 10, Claim 15, Line 26, please delete "the output" and substitute -- an output --.

Column 10, Claim 16, Line 29, please delete "the actuator" and substitute -- an actuator --.

Signed and Sealed this
Twenty-seventh Day of September, 2022

Katherine Kelly Vidal
*Director of the United States Patent and Trademark Office*